US007639034B2

(12) United States Patent
Murase et al.

(10) Patent No.: US 7,639,034 B2
(45) Date of Patent: Dec. 29, 2009

(54) FLAT DISPLAY APPARATUS AND FLAT DISPLAY APPARATUS TESTING METHOD

(75) Inventors: Masaki Murase, Kanagawa (JP); Yoshiharu Nakajima, Kanagawa (JP); Yoshitoshi Kida, Kanagawa (JP); Osamu Mitsui, Saitama (JP)

(73) Assignee: Sony Corporation, Tokyo (JP)

( * ) Notice: Subject to any disclaimer, the term of this patent is extended or adjusted under 35 U.S.C. 154(b) by 577 days.

(21) Appl. No.: 10/876,450

(22) Filed: Jun. 28, 2004

(65) Prior Publication Data

US 2005/0024306 A1 Feb. 3, 2005

(30) Foreign Application Priority Data

Jun. 30, 2003 (JP) ............................ 2003-186430

(51) Int. Cl.
*G01R 31/00* (2006.01)

(52) U.S. Cl. .......................... 324/770; 349/64; 345/904

(58) Field of Classification Search .................. 345/87, 345/904; 324/765, 770; 356/369; 349/54–55, 349/64, 149–155

See application file for complete search history.

(56) References Cited

U.S. PATENT DOCUMENTS

| | | | | |
|---|---|---|---|---|
| 5,382,095 | A | 1/1995 | Akutsu | 384/100 |
| 5,717,482 | A | 2/1998 | Akutsu et al. | 355/53 |
| 5,726,548 | A | 3/1998 | Chiba et al. | 318/625 |
| 5,858,587 | A | 1/1999 | Yamane et al. | 430/22 |
| 5,864,389 | A | 1/1999 | Osanai et al. | 355/53 |
| 5,939,852 | A | 8/1999 | Akutsu et al. | 318/640 |
| 6,008,882 | A | 12/1999 | Ito et al. | 355/53 |
| 6,028,376 | A | 2/2000 | Osanai et al. | 310/12 |
| 6,275,061 | B1 * | 8/2001 | Tomita | 324/770 |
| 6,285,444 | B1 | 9/2001 | Osanai et al. | 355/72 |
| 6,638,787 | B1 * | 10/2003 | Buchin et al. | 438/75 |
| 6,658,083 | B2 | 12/2003 | Sai | 378/34 |
| 6,791,350 | B2 * | 9/2004 | Taguchi | 324/770 |
| 6,847,083 | B2 * | 1/2005 | Murai | 257/360 |
| 6,922,243 | B2 * | 7/2005 | Lin et al. | 356/369 |
| 6,999,051 | B2 * | 2/2006 | Hsu | 345/87 |
| 2002/0132409 | A1 | 9/2002 | Akutsu et al. | 438/200 |
| 2002/0176061 | A1 | 11/2002 | Sai | 355/53 |
| 2003/0006953 | A1 | 1/2003 | Yang et al. | |
| 2003/0161189 | A1 * | 8/2003 | Park | 365/189.07 |

FOREIGN PATENT DOCUMENTS

| | | |
|---|---|---|
| JP | 2-72392 | 3/1990 |
| JP | 11-271806 | 10/1999 |
| JP | 11271806 A * | 10/1999 |

* cited by examiner

*Primary Examiner*—Chanh Nguyen
*Assistant Examiner*—Calvin C Ma
(74) *Attorney, Agent, or Firm*—Oblon, Spivak,McClelland, Maier & Neustadt, L.L.P.

(57) ABSTRACT

The present invention relates to a flat display apparatus and a flat display apparatus testing method, and is, for example, applicable to a liquid crystal display apparatus where drive circuits are integrally formed on an insulating substrate. The present invention is capable of carrying out a reliable screening of defective pixels so as to effectively avoid deterioration in reliability even in cases where transistors with low withstand voltages are employed. A common line-side wiring pattern COM of wiring patterns LCC and COM of a capacitor of pixels is connected to a precharge circuit externally in an independent manner.

3 Claims, 4 Drawing Sheets

FLAT DISPLAY APPARATUS AND FLAT DISPLAY APPARATUS TESTING METHOD

CROSS REFERENCE TO RELATED APPLICATIONS

The present document is based on Japanese Priority Document JP2003-186430, filed in the Japanese Patent Office on Jun. 30, 2003, the entire contents of which being incorporated herein by reference.

BACKGROUND OF THE INVENTION

1. Field of the Invention

The present invention relates to a flat display apparatus and a flat display apparatus testing method, and is, for example, applicable to a liquid crystal display apparatus where drive circuits are integrally formed on an insulating substrate.

2. Description of Related Art

In recent years, for example, a liquid crystal display apparatus that is a flat display apparatus applied to mobile terminal devices such as PDA's and mobile telephones etc., have been proposed where drive circuits of a liquid crystal display panel are formed integrally on a glass substrate that is an insulating substrate constituting the liquid crystal display panel.

These liquid crystal display apparatuses are such that each pixel is formed by a liquid crystal cell, a polysilicon TFT (Thin Film Transistor) that is a switching device of this liquid crystal cell, and a hold capacitor. A display section is formed by arranging these pixels in a matrix and is driven by various drive circuits arranged around the periphery of the display section, thereby displaying various images.

With liquid crystal display apparatuses, when there is even just one defect in a multiplicity of pixels arranged in a matrix, this defective pixel is observed as a bright luminescent spot and the quality of the display image deteriorates considerably. Various methods have therefore been proposed for detecting these types of defective pixels, for example, disclosed in Japanese Patent Application Publication Number 2002-221547.

SUMMARY OF THE INVENTION

However, with these liquid crystal display apparatuses, there are cases where defective pixels occur when used in the marketplace even they are not detected by tests at the time of shipping. The present invention has therefore made it possible to detect this type of pixels, which may become defective in the marketplace, at the time of shipping tests by performing screening using accelerated testing.

As shown in FIG. 3, in the liquid crystal display apparatus, each pixel is formed by a liquid crystal cell 2, polysilicon TFT 3, and hold capacitor 4. The polysilicon TFT 3 is connected to a horizontal drive circuit and a vertical drive circuit by a signal line (column line) LC and a gate line (row line) LR, respectively. It is then possible for a screening testing to detect pixels as defective pixels that may become defective in the marketplace beforehand by applying a pulsed high-voltage such as shown by numeral A to a common line COM that is a wiring pattern on the opposite electrode side to that of a signal line side of the hold capacitors 4. This pulsed voltage is set about a peak-to-peak value of 15V which is approximately twice of the normal operating voltage, it is set to a voltage larger than a withstand voltage Va between the transistor 3 and capacitor 4 of pixels that are nondefective pixels and do not become defective on the marketplaces.

Because of this, as shown in FIG. 4, in this type of liquid crystal display apparatus 1, a wiring pattern from a CS drive circuit 9, which precharges the signal line LC to a predetermined potential, is taken temporarily outside via external terminals T1 and T2. In this way, predetermined test equipment can be connected the wiring patter and screening tests are executed, and further, enabling various kinds of tests executed.

Namely, in the liquid crystal display apparatus 1 shown in FIG. 4, a display section 11 is formed by arranging pixels, which is constituted by a liquid crystal cell 2, polysilicon TFT 3 and hold capacitors 4 on a glass substrate 10 in the form of a matrix. A signal line LC and gate line LR of this display section are then connected to a horizontal drive circuit 12 and a vertical drive circuit 13. The horizontal drive circuit 12 and the vertical drive circuit 13 are formed on the glass substrate 10 around the periphery of the display section 11. The horizontal drive circuit 12 takes gradation data that indicates gradation of each pixel as sequential input and outputs drive signals for each pixel sequentially in line units to the display section 11. The vertical drive circuit 13 outputs a select signal for selecting outputs of the horizontal drive circuit 12 to the display section 11. In this way, it is possible to display desired images on the display section 11 by driving pixels of the display section arranged in the form of a matrix, which are selected by the gate line LR and drove by the signals line LC.

The liquid crystal display apparatus 1 is configured so that it is possible to cut the connection between the horizontal drive circuit 12 and the signal line LC via a switch circuit 15 constituted by a transistor that is an active device and it is possible to connect the signal line LC to the common line COM via a similar switch circuit 16. In this way, in the liquid crystal display apparatus 1, after the switch circuits 15 and 16 are set to an off state and an on state, respectively, and the signal line LC is precharged to a predetermined voltage by the CS drive circuit 9, the switch circuits 15 and 16 are changed over to being an on state and an off state, respectively, so that each pixel can be driven. This precharging is executed at predetermined timings according to the drive format such as frame reversal and line reversal etc. occurring at the liquid crystal display apparatus 1. In the configuration shown in FIG. 4, C is an external capacitor and 18 is a pad electrode.

A screening testing is executed as follows. The voltage at the both end terminals of the hold capacitor 4 is set to a predetermined voltage by setting the switch circuits 15 and 16 using for precharging in an off state and on state, respectively, while the connection between the terminals T1 and T2 are cut, after that, the switch circuit 16 is set to an off state and a predetermined voltage is applied to the terminal T2.

However, in this testing method, a pulsed high-voltage is applied not only to the hold capacitor 4, but also to the switch circuit 16. As a result, in the case of using transistors with a high withstand voltage, screening is possible without there being any problems, but in the case of a liquid crystal display apparatus 1 configured by using transistors with a low withstand voltage, the screening testing is rather detrimental to the reliability of the liquid crystal display apparatus 1.

In order to take into consideration the above points, the present invention provides a flat display apparatus and a flat display apparatus testing method capable of executing screening of defective pixels in a reliable manner while effectively avoiding deterioration in reliability even in cases of the configurations thereof employing transistors with a low withstand voltage.

In order to resolve these problems, the invention is applied to a flat display apparatus where a display section composed of pixels arranged in a matrix from and a drive circuit for displaying desired images on the display section by selecting pixels of the display section using a gate line and driving with signal lines, the display section and the drive circuit are integrally formed on a substrate. The flat display apparatus of the present invention has a precharge circuit for precharging the signal lines at a predetermined timing; wherein the pixel includes a capacitor being charged by the signal line potential selected by the gate lines, wherein at least an electrode-side wiring pattern connected to an electrode on the opposite side to the signal line side of the capacitor is insulated from a signal line-side wiring pattern connecting the signal lines to the precharge circuit, and is connected to the precharge circuit at the outside of the substrate.

Further, the invention is applied to a test method for a flat display apparatus where a display section in which pixels arranged in a matrix from and a drive circuit for displaying desired images on the display section by selecting pixels of the display section using gate lines and driving with signal lines, the display section and the drive circuit are integrally formed on a substrate. The flat display apparatus is provided with a precharge circuit for precharging the signal lines at a predetermined timing; wherein a capacitor being charged by the signal line potential selected by the gate lines, wherein at least an electrode-side wiring pattern connected to an electrode on the opposite side to the signal line side of the capacitor is insulated from a signal line-side wiring pattern connecting the signal lines to the precharge circuit, and is connected to the precharge circuit at the outside of the substrate, and the test method for the flat display apparatus detects portions associated with pixel defects by applying a pulsed high-voltage between a portion taking the electrode-side wiring pattern to the outside of the substrate and a portion connecting the wiring pattern to the precharge circuit.

According to the above configuration of the flat display apparatus where a display section in which pixels arranged in a matrix form and a drive circuit for displaying desired images on the display section by selecting pixels of the display section using gate lines and driving with signal lines, the display section and the drive circuit are integrally formed on a substrate, and provided with a precharge circuit for precharging the signal lines at a predetermined timing, wherein the pixel includes a capacitor being charged by the signal line potential pixels selected by the gate lines, wherein at least an electrode-side wiring pattern connected to an electrode on the opposite side to the signal line side of the capacitor is insulated from a signal line-side wiring pattern connecting the signal lines to the precharge circuit, and is connected to the precharge circuit at the outside of the substrate, it is then possible to execute the screening testing without applying a high-voltage to the signal line side by blocking the external connection portion, and applying a pulsed high-voltage to the electrode-side wiring pattern while maintaining the signal line-side wiring pattern at a predetermined potential. As a result, application of a high-voltage to active device of TFT's etc. provided at the signal line side is avoided, and it is possible to execute reliable screening of defective pixels while effectively avoiding deterioration in reliability even in the case of configurations employing active devices of low withstand voltages.

In this way, according to the above configuration, it is possible to provide a flat display apparatus test method capable of executing reliable screening of defective pixels while effectively avoiding deterioration in reliability even in the case of configurations employing active devices of low withstand voltages.

According to the present invention described above, by connecting a common line-side wiring pattern of wiring patterns for capacitors of a pixel to a precharge circuit externally in an independent manner, it is possible to carry out reliable screening of defective pixels so as to effectively avoid deterioration in reliability even in cases where a liquid crystal display apparatus employs transistors with low withstand voltages.

DESCRIPTION OF THE PREFERRED EMBODIMENT

In the following, a detailed description of embodiments of the present invention is given with reference to the appropriate drawings.

Figure 1:
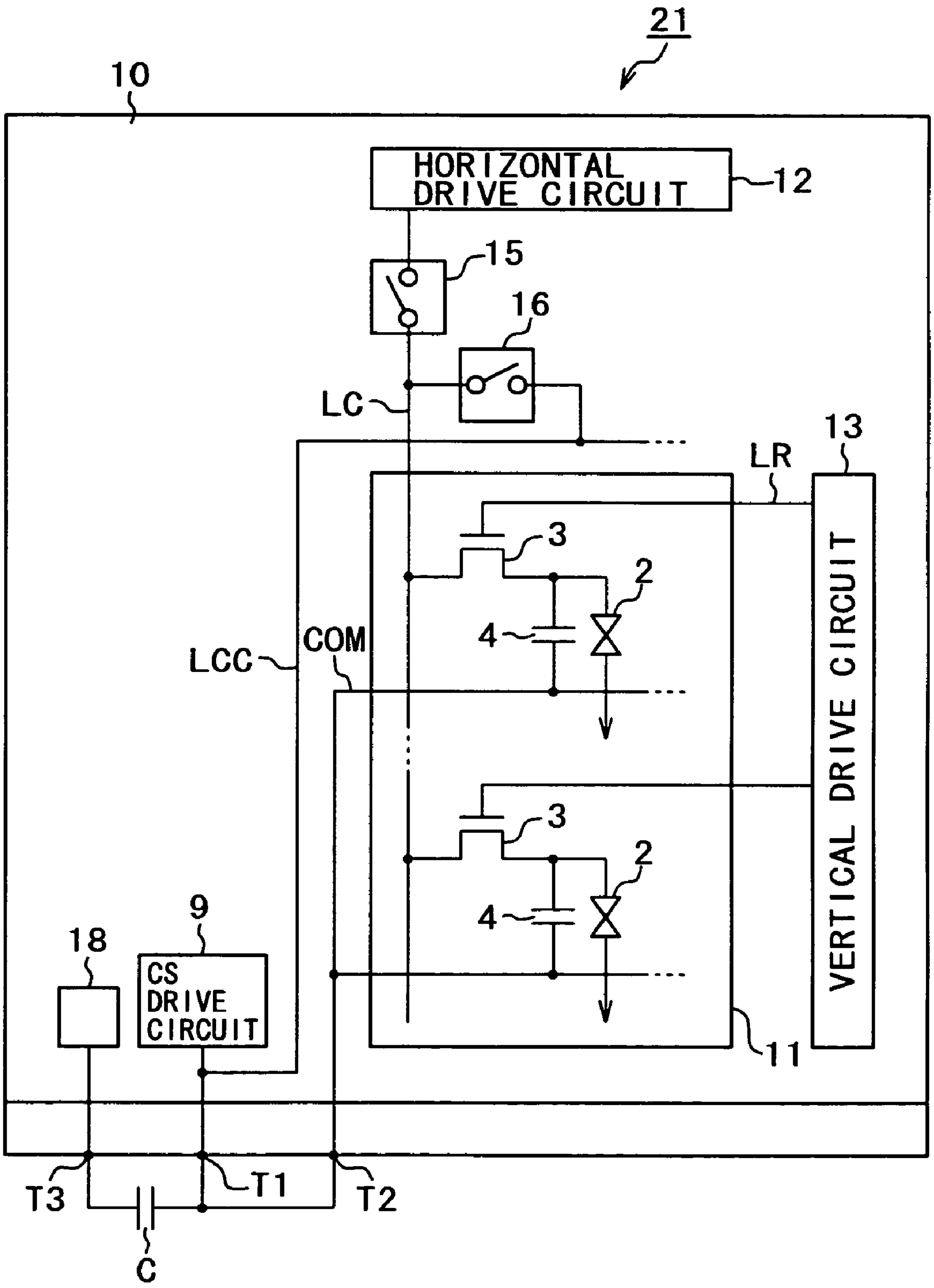
FIG. 1 is a block view showing a liquid crystal display apparatus of an embodiment of the present invention.
Figure 4:
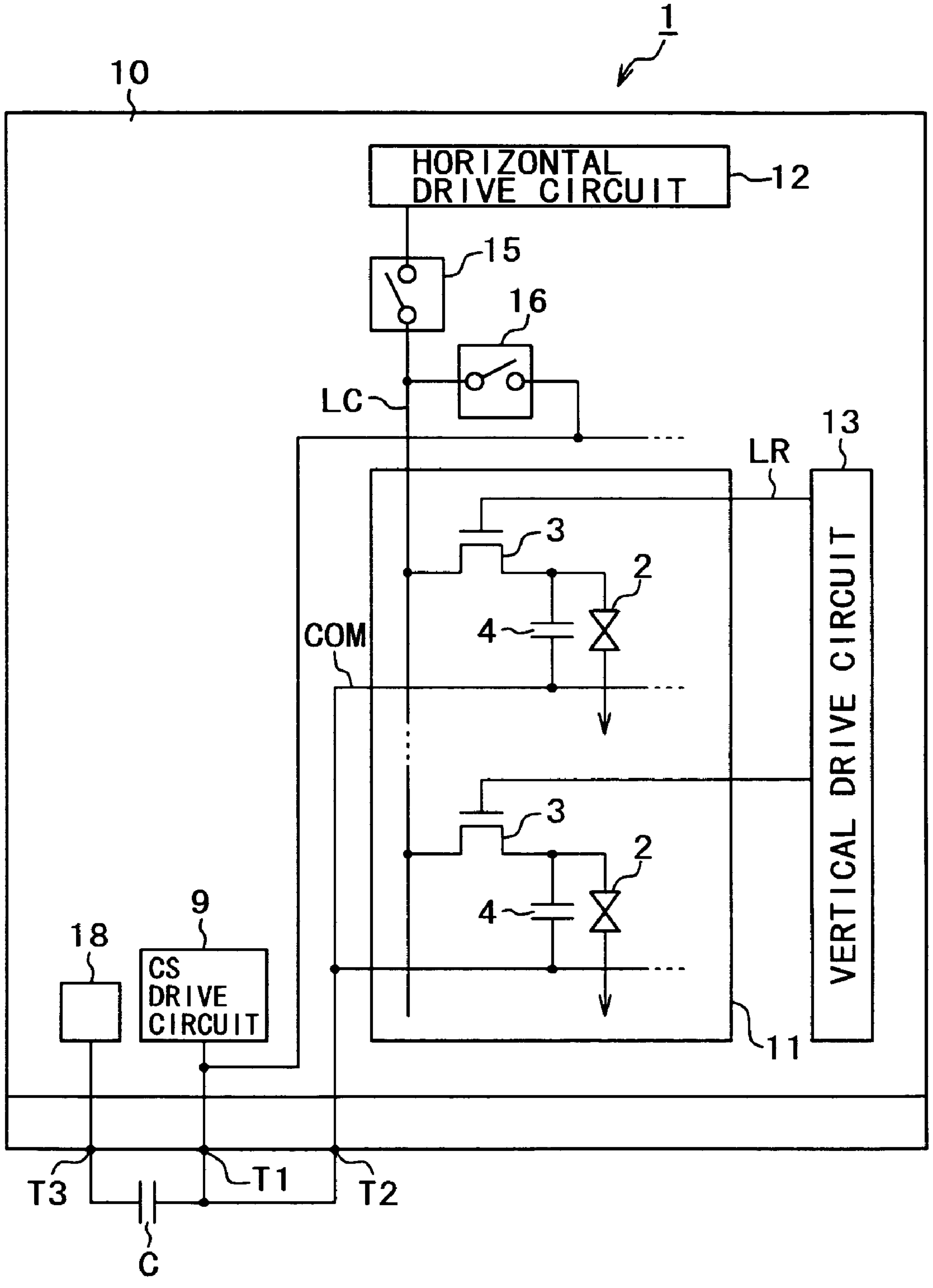
FIG. 4 is a block view showing a liquid crystal display apparatus of the related art.

FIG. 1 is a block view showing a liquid crystal display apparatus of an embodiment of the present invention through comparison with FIG. 4. The liquid crystal display apparatus 21 has the similar configuration as the liquid crystal display apparatus 1 described above in FIG. 4 and is shown assigned with corresponding numerals, and duplicated descriptions thereof are therefore omitted.

In the liquid crystal display apparatus 21, a display section 11 on which pixels are arranged in a matrix form and drive circuits 12 and 13 that display desired images on the display section 11 as a result of selecting the pixels of the display section 11 using a gate line LR and of driving the pixels using a signal line LC are formed integrally on a glass substrate. Further, a CS drive circuit 9 is provided on this glass substrate 10 as a precharge circuit for precharging the signal line LC at a predetermined timing.

In the liquid crystal display apparatus 21, a wiring pattern LCC on the signal line LC side for the precharge process is connected to the CS drive circuit 9 on the substrate 10 and is also connected to the signal line LC via a switch circuit 16. Moreover, a common line COM that is a wiring pattern on the opposite side to a wiring pattern on the signal line side of the hold capacitor 4 is insulated from the wiring pattern LCC on the signal line LC side and is connected to a terminal T2. The wiring pattern LCC on the signal line LC side is connected to a terminal T1 adjacent to the terminal T2. As a result, in the liquid crystal display apparatus 21, the electrode-side wiring pattern COM of the hold capacitor 4, which is connected to the electrode on the opposite side to the signal line LC, is insulated from the signal line-side wiring pattern LCC connecting the signal line LC to the precharge circuit 9, and is connected to the precharge circuit 9 at the outside of the substrate 10.

In this way, in the liquid crystal display apparatus 21, after the signal line LC is precharged to the potential of the hold capacitor 4 using a path different to the liquid crystal display apparatus 1 of the conventional configuration, each of the pixels is driven by the horizontal drive circuit 12 and the vertical drive circuit 13 so that the desired image is displayed.

Figure 2:
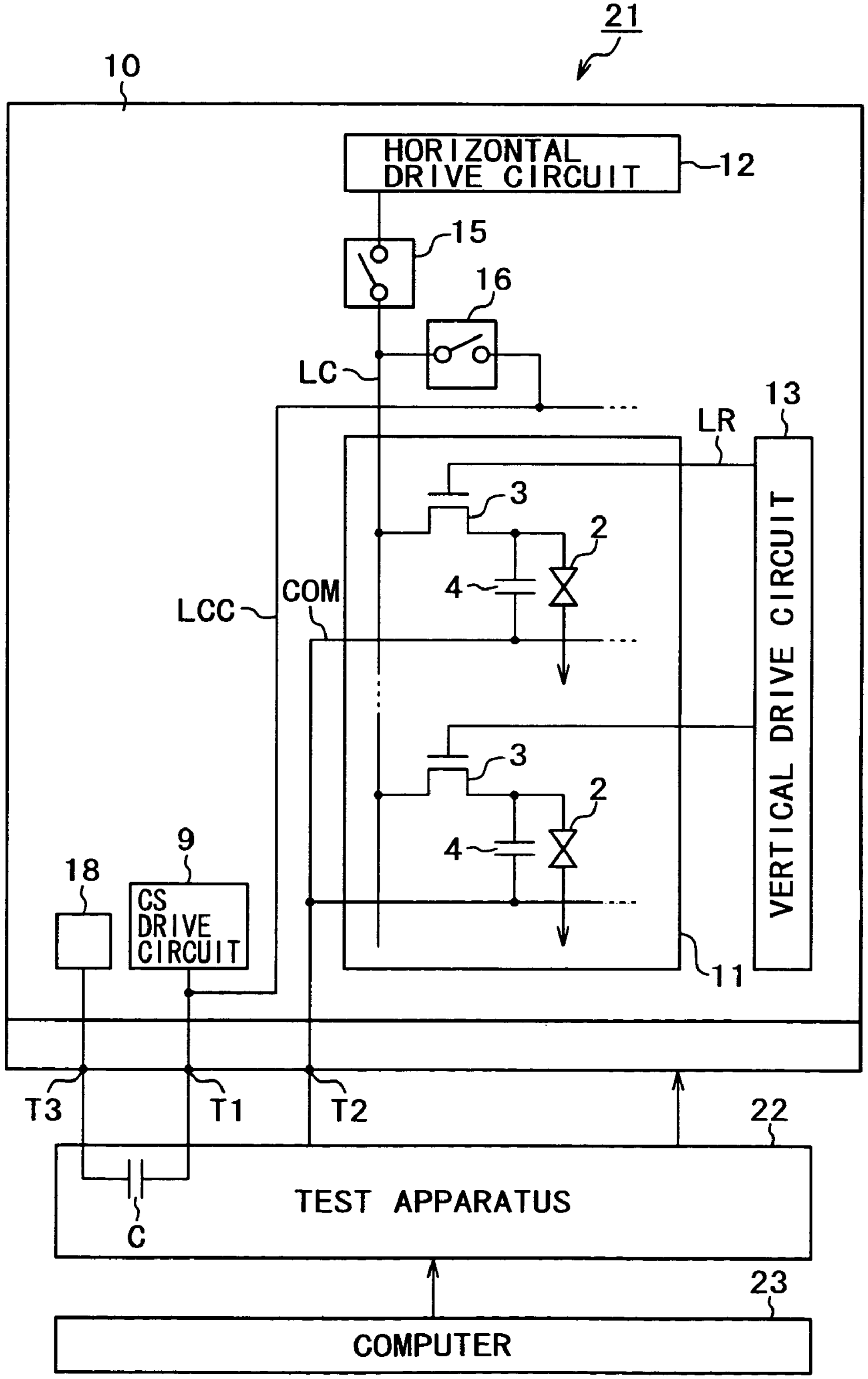
FIG. 2 is a block view illustrating testing for the liquid crystal display apparatus of FIG. 1.

FIG. 2 is a block view showing connection of the liquid crystal display apparatus 21 and a test apparatus 22 at the time of testing. In this embodiment, after forming each of the various drive circuits 12 and 13 and display section 11 etc. on the glass substrate 10, various operation tests are executed by this test apparatus 22. This operation test is executed by controlling the operation of the test apparatus 22 using a controller 23, outputting from the test apparatus 22 an operation reference clock and various display data for the test to the liquid crystal display apparatus 21, and confirming the operation of the liquid crystal display apparatus 21. In this embodiment, a screening test for defective pixels is performed as one item of the test to be executed.

In this screening test, the test apparatus 22 sets the switch circuits 15 and 16 in an off state and on state respectively, and also sets the terminals T1 and T2 to predetermined potentials. In this embodiment, this predetermined potential can be set to earth potential by, for example, connecting the terminals T1 and T2 to a ground line of the test apparatus 22.

Figure 3:
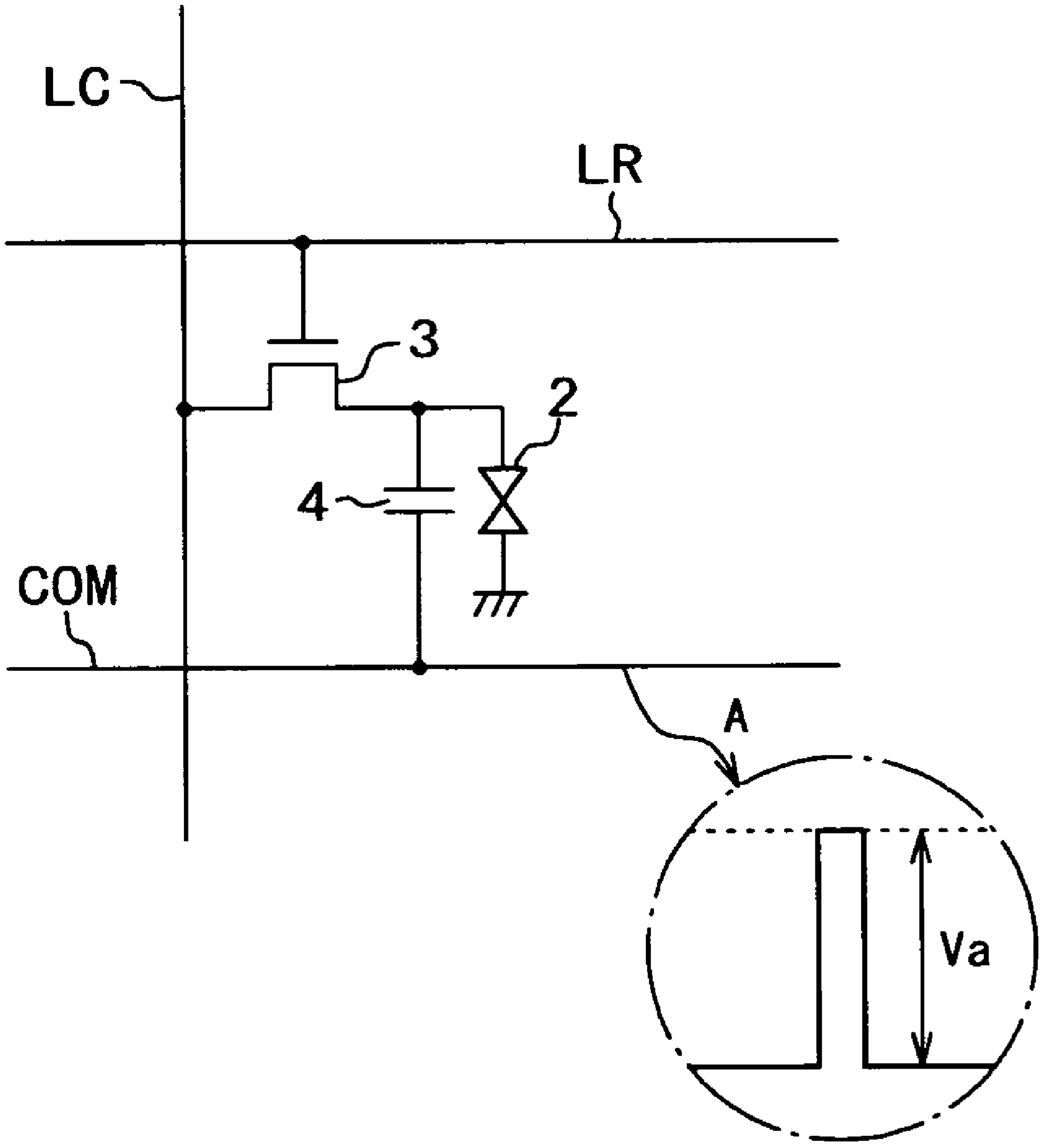
FIG. 3 is a connection diagram illustrating defective pixel screening.

Next, the test apparatus 22 separates the terminal T2 from earth potential, and the pulsed high-voltage described above in FIG. 3 is applied to the liquid crystal display apparatus 21. As a result, in this embodiment, a voltage in excess of the operating voltage is applied between the transistor 3 and the hold capacitor 4 for each pixel, and detection is then possible in a succeeding detection process for pixels that may become defective pixels upon arrival in the marketplace.

In this embodiment, however, it is possible to execute the screening testing in such a manner that a high-voltage is not applied to the switch circuit 16 by connecting the common line-side wiring pattern COM of the wiring patterns LCC and COM for the capacitor 4 of the pixels to the precharge circuit 9 externally in an independent manner. It is therefore possible to execute screening of defective pixels while effectively avoiding deterioration in reliability even in cases of configurations employing transistors with low withstand voltages.

According to the above configuration, by connecting a common line-side wiring pattern of a capacitor of a pixel to a precharge circuit externally in an independent manner, in this way, it is possible to carry out reliable screening of defective pixels so as to effectively avoid deterioration in reliability even in cases where transistors with low withstand voltages are employed.

In the embodiment described above, a description is given of the case where only the common line-side wiring pattern COM is connected externally but the present invention is by no means limited to this respect, and it is also possible to collectively connect the wiring pattern LCC on the signal line side to the SC drive circuit externally.

Further, in the embodiment described above, a description is given of the case of applying the present invention to TFT liquid crystal constituted by a display section etc. formed on a glass substrate but the present invention is by no means limited in this respect, and may also be broadly applied to various flat display apparatuses, for example, various liquid crystal display apparatuses such as CGS (Continuous Grain Silicon) liquid crystal etc. and further to EL (Electro Luminescence) display apparatuses etc.

The invention claimed is:

1. A flat display apparatus, comprising:

a display section integrally formed on a substrate and having a plurality of pixels arranged in a matrix form, each pixel including a signal line and a gate line;

a first drive circuit configured to select at least one gate line of a pixel from said plurality of pixels;

a second drive circuit configured to drive at least one signal line of said pixel from said plurality of pixels, said first and second drive circuits configured to be operated to display desired images on said display section; and a precharge circuit integrally formed on said substrate, connected to a first external terminal located outside of said substrate, and configured to precharge said at least one signal line of said pixel from said plurality of pixels at a predetermined timing via a signal line-side wiring pattern connecting said at least one signal line of said pixel to said precharge circuit, wherein said pixel from said plurality of pixels includes a capacitor charged at a potential of said at least one signal line upon selection of said at least one gate line, and at least an electrode-side wiring pattern, connected to said capacitor at a side opposite to a signal line-side of said capacitor, is insulated at all times from the signal line-side wiring pattern inside said substrate, and is connected to a second external terminal located outside of said substrate, said second external terminal being connected to said first external terminal.

2. The flat display apparatus according to claim 1, wherein said signal line-side wiring pattern is connected to said at least one signal line of said pixel of said plurality of pixels via a switch circuit including an active device, said active device made of low-temperature polysilicon or CGS.

3. A test method for a flat display apparatus including a display section having a plurality of pixels arranged in a matrix form, each pixel including a signal line and a gate line, said test method comprising:

selecting at least one gate line of a pixel from said plurality of pixels;

driving at least one signal line of said pixel from said plurality of pixels;

displaying desired images on said display section;

precharging, by a precharge circuit integrally formed on said substrate, connected to a first external terminal located outside of said substrate, said at least one signal line of said pixel at a predetermined timing via a signal line-side wiring pattern connecting said at least one signal line of said pixel to said precharge circuit;

charging a capacitor of said pixel from said plurality of pixels at a potential of said at least one signal line upon selection of said at least one gate line; and applying a pulsed voltage between a portion of an electrode-side wiring pattern connected to the precharge circuit via a second external terminal located outside of said substrate, said second external terminal connected to the first external terminal, and a portion of said wiring pattern connected to said precharge circuit to detect pixel defects associated with at least said pixel from said plurality of pixels, wherein said electrode-side wiring pattern is connected to said capacitor via an electrode at a side opposite to a signal-line side of said capacitor and is insulated at all times from the signal line-side wiring pattern inside said substrate.

* * * * *